United States Patent
Lee et al.

(10) Patent No.: US 10,607,945 B1
(45) Date of Patent: Mar. 31, 2020

(54) SEMICONDUCTOR PACKAGE

(71) Applicant: SAMSUNG ELECTRONICS CO., LTD., Suwon-si (KR)

(72) Inventors: Suk Ho Lee, Suwon-si (KR); Dong Joon Oh, Suwon-si (KR); Ju Suk Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/542,470

(22) Filed: Aug. 16, 2019

(30) Foreign Application Priority Data

Oct. 2, 2018 (KR) .................. 10-2018-0117696

(51) Int. Cl.
| | |
|---|---|
| *H01L 23/552* | (2006.01) |
| *H01L 23/00* | (2006.01) |
| *H01L 23/498* | (2006.01) |
| *H01L 21/56* | (2006.01) |

(52) U.S. Cl.
CPC .......... *H01L 23/552* (2013.01); *H01L 21/561* (2013.01); *H01L 23/49838* (2013.01); *H01L 24/24* (2013.01); *H01L 24/25* (2013.01); *H01L 2224/24195* (2013.01); *H01L 2224/25171* (2013.01)

(58) Field of Classification Search
None
See application file for complete search history.

(56) References Cited

U.S. PATENT DOCUMENTS

| | | | |
|---|---|---|---|
| 2013/0249101 A1* | 9/2013 | Lin ..................... | H01L 24/19 |
| | | | 257/773 |
| 2016/0336249 A1* | 11/2016 | Kang .................. | H01L 23/3128 |
| 2017/0025361 A1 | 1/2017 | Lee et al. | |
| 2017/0103951 A1* | 4/2017 | Lee ..................... | H01L 23/3121 |
| 2017/0330839 A1 | 11/2017 | Kim et al. | |
| 2017/0345795 A1* | 11/2017 | Yang .................... | H01L 24/19 |
| 2017/0373016 A1 | 12/2017 | Lin et al. | |

FOREIGN PATENT DOCUMENTS

KR    10-2017-0128717 A    11/2017

* cited by examiner

*Primary Examiner* — J. E. Schoenholtz
(74) *Attorney, Agent, or Firm* — Sughrue Mion, PLLC

(57) ABSTRACT

A semiconductor package includes a frame having a first through-hole, a semiconductor chip disposed on the first through-hole an having an active surface on which a connection pad is disposed and an inactive surface, a first encapsulant covering at least a portion of the inactive surface and a side surface of the semiconductor chip, a connection structure disposed on the active surface of the semiconductor chip and including a redistribution layer electrically connected to the connection pad of the semiconductor chip and a ground pattern layer, a side surface cover layer covering at least an outer side surface of the frame, and a metal layer disposed on the upper surface of the first encapsulant and extending downwardly along the side surface cover layer to cover the side surface cover layer and a portion of the side surface of the connection structure.

20 Claims, 15 Drawing Sheets

SEMICONDUCTOR PACKAGE

CROSS-REFERENCE TO RELATED APPLICATION(S)

This application claims benefit of priority to Korean Patent Application No. 10-2018-0117696 filed on Oct. 2, 2018 in the Korean Intellectual Property Office, the disclosure of which is incorporated herein by reference in its entirety.

TECHNICAL FIELD

The present disclosure relates to a semiconductor package, for example, to a fan-out semiconductor package.

BACKGROUND

As electronic products become smaller and higher in performance, the distance between components becomes closer and operating speeds are greatly increased. As a result, a problem of malfunctioning of the device due to electromagnetic wave interference between components has been a problem. Thus, recently, interest in electromagnetic wave shielding technologies has been growing. In the case of smartphones, electromagnetic wave shielding technology has only been applied to some chips, such as an initial communication chip. However, recently, the application of electromagnetic wave shielding technology has been expanded to AP, RF chips, and the like.

As an electromagnetic wave shielding technology, a metal can structure or a deposition method such as sputtering is mainly used. When a deposition method such as sputtering is used, a process is complicated by forming an EMI shielding layer after singulation of a semiconductor package, and it may be difficult to secure deposition coverage on a portion on which a glass fiber or a ceramic filler is present. Therefore, it may be more difficult to secure coverage of the EMI shielding layer on a side surface than on an upper surface of the package.

SUMMARY

An aspect of the present disclosure is to provide a semiconductor package with improved lateral shielding performance.

According to an aspect of the present disclosure, a semiconductor package may be provided, in which a coating layer is formed on a side surface and then an EMI shielding layer is formed.

According to an aspect of the present disclosure, a semiconductor package may include: a frame having a first through-hole; a semiconductor chip disposed in the first through-hole of the frame, and having an active surface on which a connection pad is disposed and an inactive surface opposing the active surface; a first encapsulant covering at least a portion of each of the inactive surface and a side surface of the semiconductor chip; a connection structure disposed on the active surface of the semiconductor chip, and including a redistribution layer electrically connected to the connection pad of the semiconductor chip and a ground pattern layer; a side surface cover layer covering at least an outer side surface of the frame at a periphery of the frame; and a metal layer disposed on an upper surface of the first encapsulant, and extending downwardly from the upper surface of the first encapsulant along the side surface cover layer to cover the side surface cover layer and a portion of a side surface of the connection structure.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
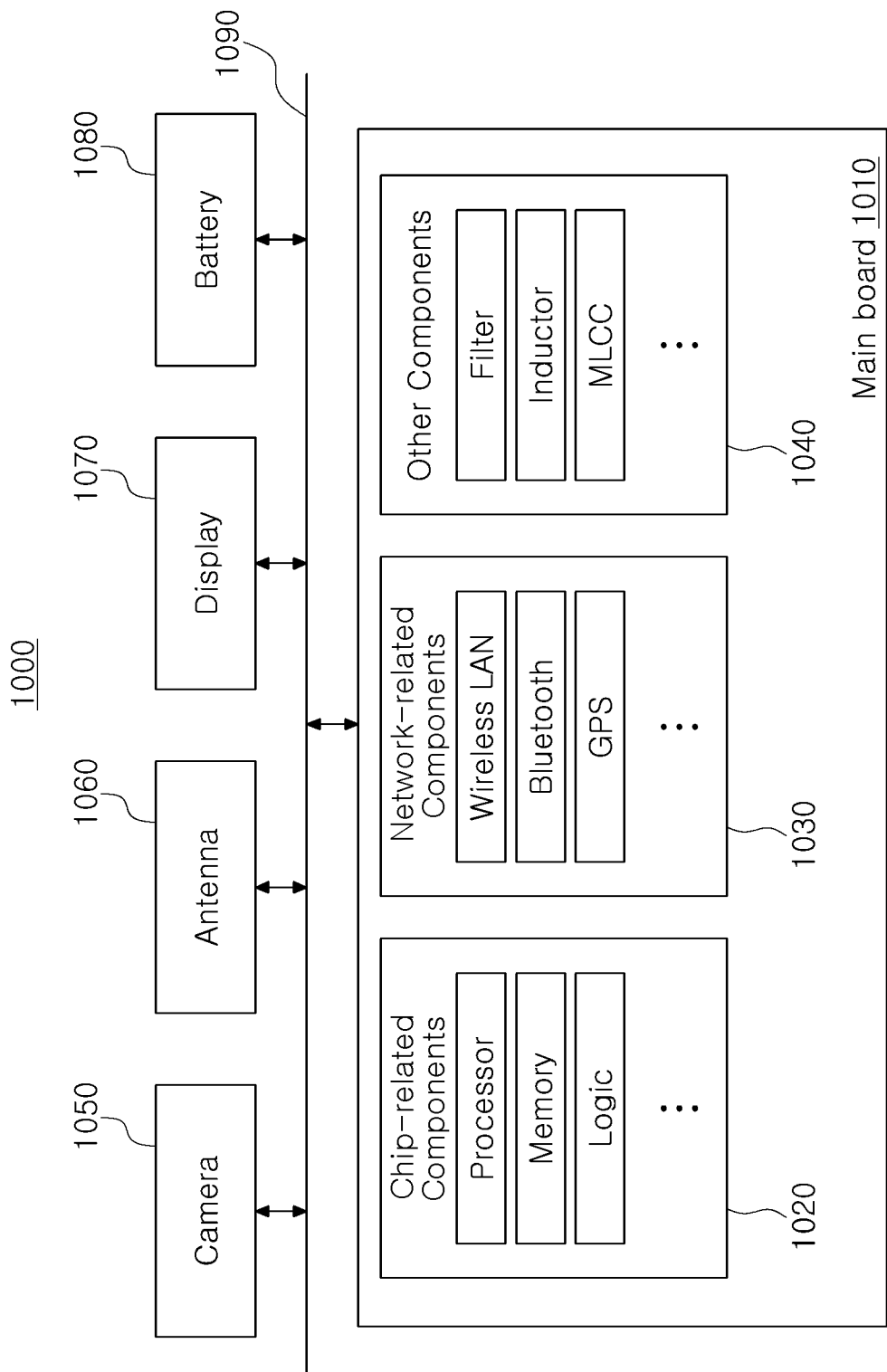
FIG. 1 is a schematic block diagram illustrating an example of an electronic device system.

Hereinafter, embodiments of the present disclosure will be described as follows with reference to the attached drawings. In the drawings, sizes and shapes of elements will be exaggerated or reduced for clear description.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to,"

or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures.

For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Electronic Device

FIG. 1 is a block diagram illustrating an exemplary embodiment of electronic device system.

Referring to FIG. 1, an electronic device 1000 may accommodate a mainboard 1010 therein. The mainboard 1010 may include chip related components 1020, network related components 1030, and other components 1040, and the like, physically and/or electrically connected. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
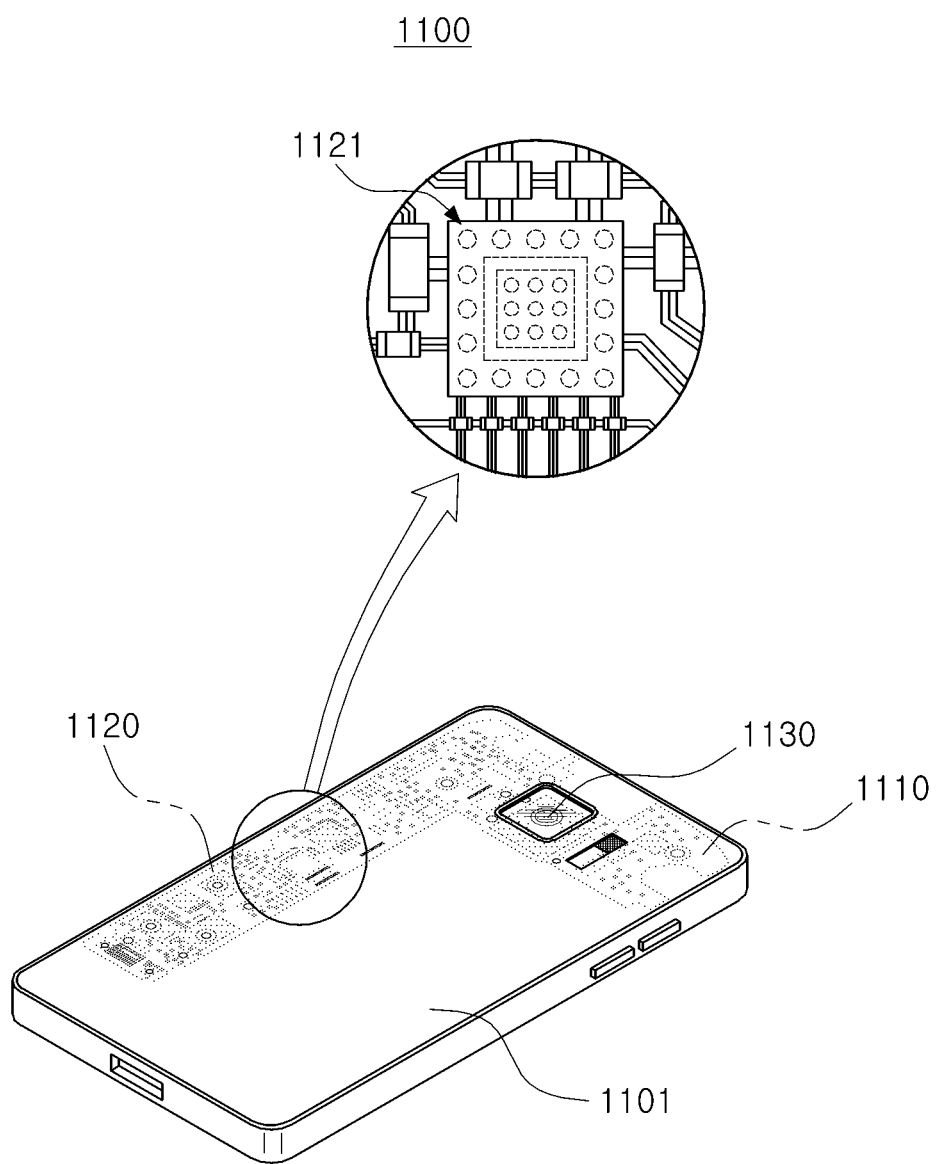
FIG. 2 is a perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
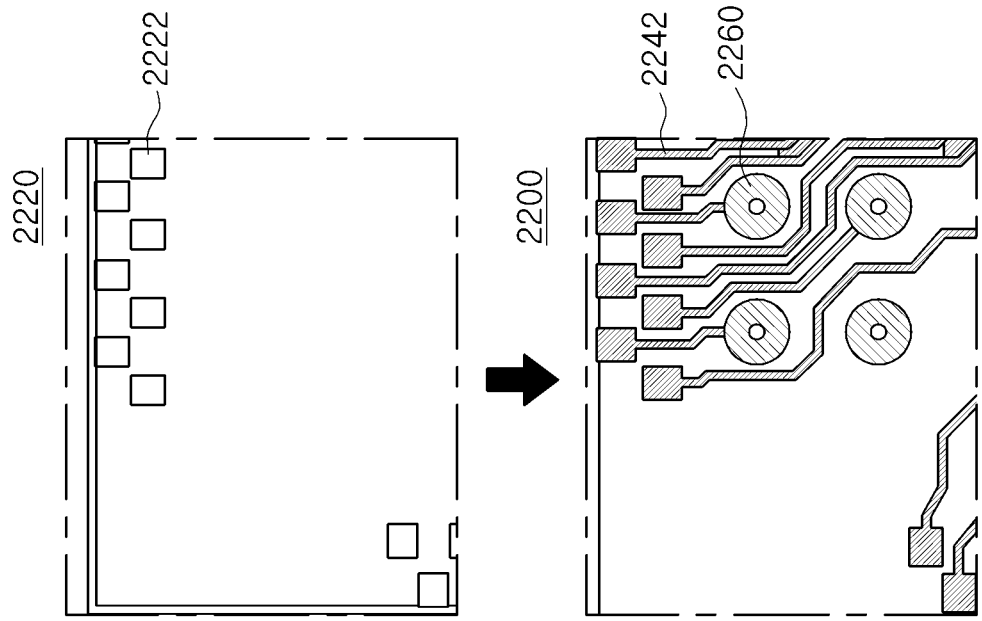
FIGS. 3A and 3B are schematic cross-sectional views of a state a fan-in semiconductor package before and after being packaged, respectively.
Figure 3A:
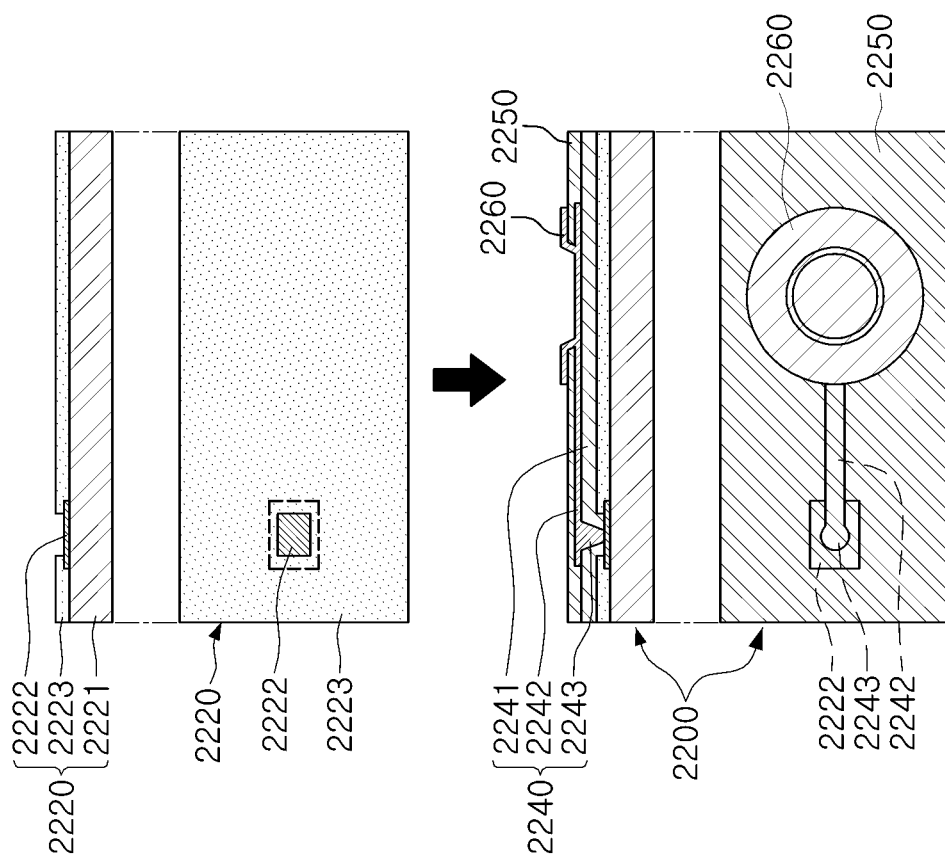

FIGS. 3A and 3B are cross-sectional views illustrating a state of a fan-in semiconductor package before and after being packaged, respectively.

Figure 4:
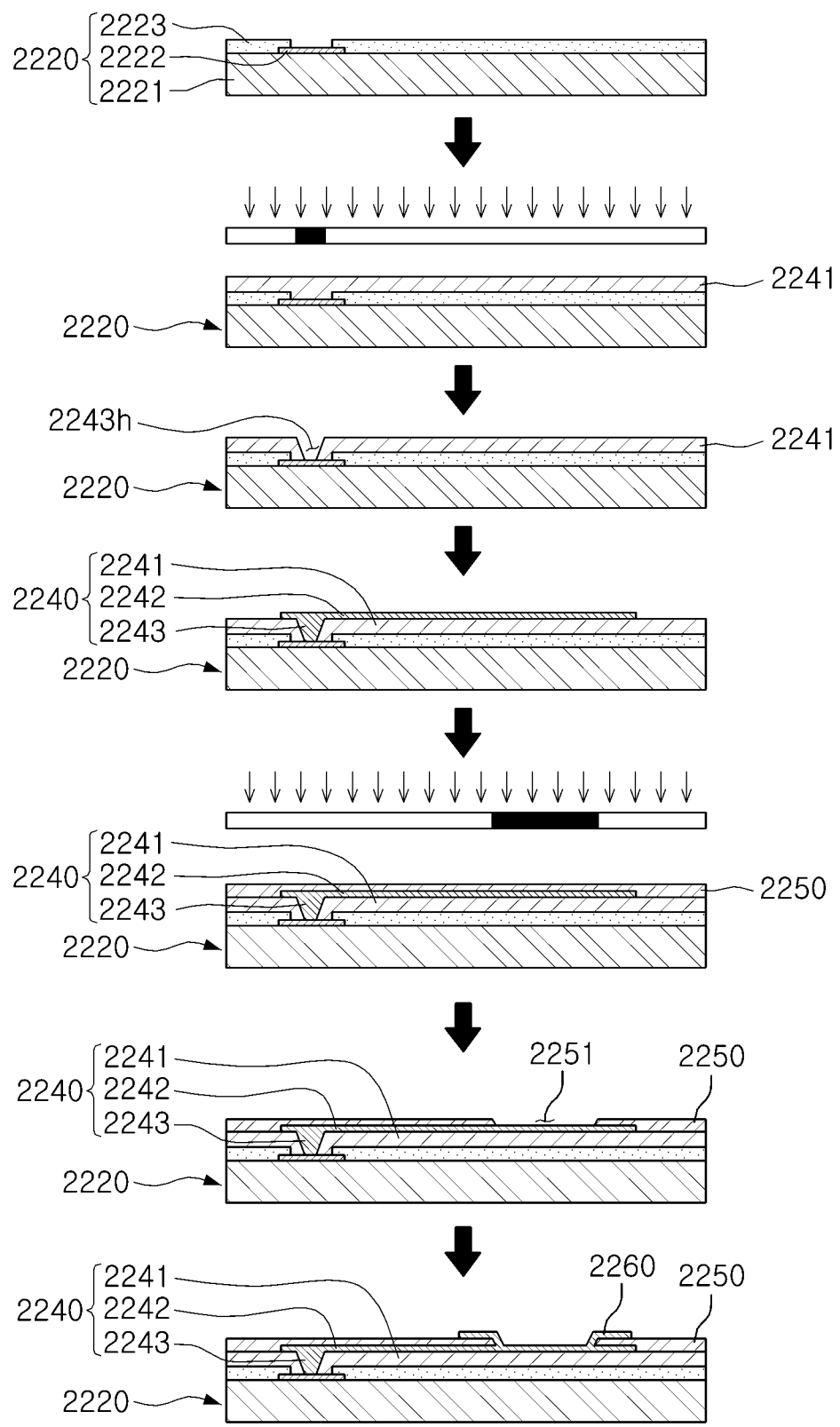
FIG. 4 is a schematic cross-sectional view illustrating a packaging process of a fan-in semiconductor package.

FIG. 4 is a cross-sectional view illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least a portion of the connection pads 2222. In this case, since the connection pads 2222 may be significantly small, it may be difficult to mount the integrated circuit (IC) on an intermediate level printed circuit board (PCB) as well as on a mainboard of an electronic device, and the like.

Accordingly, to redistribute the connection pads 2222, a connection structure 2240 may be formed in accordance with a size of the semiconductor chip 2220 on the semiconductor chip 2220. The connection structure 2240 may be formed by forming an insulating layer 2241 on the semiconductor chip 2220 using an insulation material such as a photoimagable dielectric (PID) insulation material, forming a via hole 2243h opening the connection pads 2222, and forming wiring patterns 2242 and vias 2243. Then, a passivation layer 2250 protecting the connection structure 2240 may be formed, an opening 2251 may be formed, and an underbump metal layer 2260, and the like, may be formed. Thus, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads of the semiconductor chip, such as input/output (I/O) terminals, are disposed inside the semiconductor chip, and may have excellent electrical properties and be produced at a relatively low cost. Therefore, many elements mounted in smartphones have been manufactured in a fan-in semiconductor package form. Specifically, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip of a compact size. In addition, due to the disadvantage as above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals may not be sufficient to directly mount the fan-in electronic component package on the mainboard of the electronic device.

Figure 5:
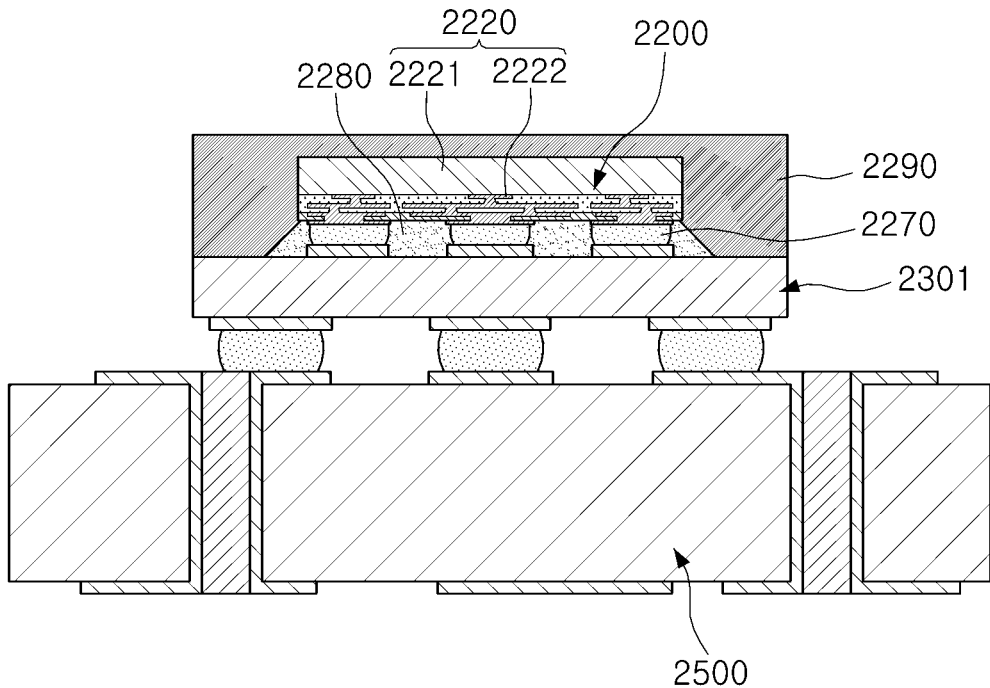
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
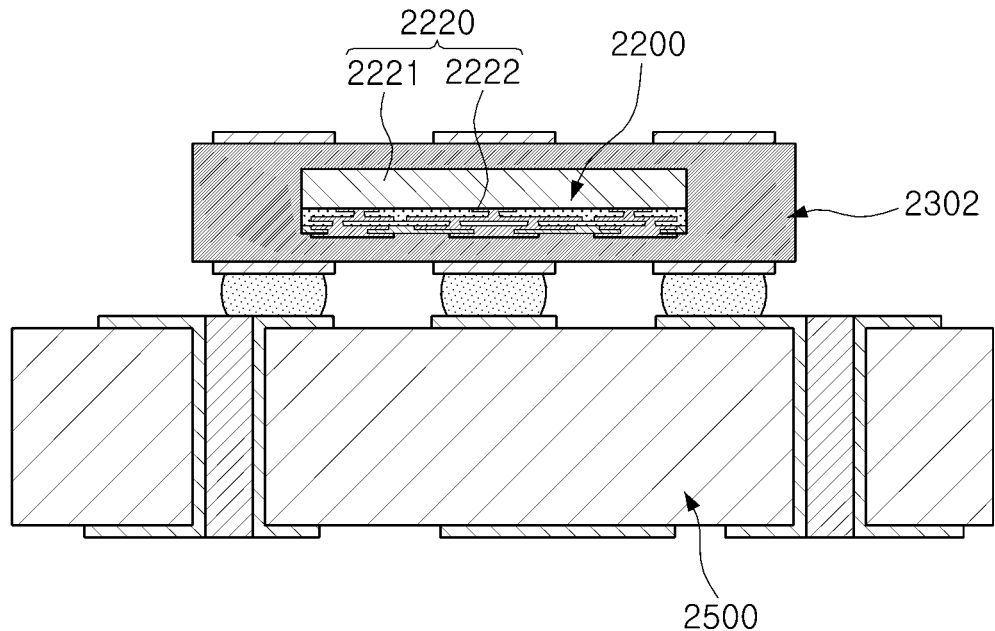
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which the fan-in semiconductor package 2200 is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Thus, the fan-in semiconductor package may be mounted on the separate interposer substrate and then mounted on the mainboard of the electronic device after going through a packaging process again, or may be mounted and used on the mainboard of the electronic device in a state in which it is embedded in the interposer substrate.

Fan-Out Semiconductor Package

Figure 7:
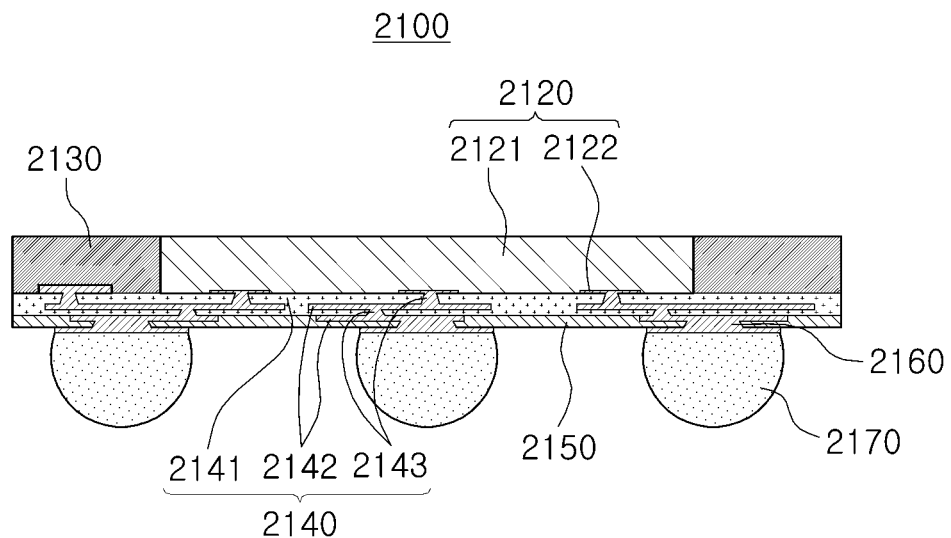
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, an outer side of a semiconductor chip 2120 may be protected by an encapsulant 2130, for example, and connection pads 2122 of the semiconductor chip 2120 may be redistributed outwardly of the semiconductor chip 2120 by a connection structure 2140. In this case, a passivation layer 2202 may further be formed on the connection structure 2140, and an underbump metal layer 2160 may further be formed in openings of the passivation layer 2202. Solder balls 2170 may further be formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals are redistributed and disposed up to an external portion of the semiconductor chip through the connection structure formed on the semiconductor chip. As described above, in the fan-in semiconductor package, as all I/O terminals of the semiconductor chip need to be disposed inside the semiconductor chip, a size of the semiconductor chip is decreased, and a size and a pitch of balls need to be decreased as well. Accordingly, it may not be possible to use a standardized ball layout in the fan-in semiconductor package. On the other hand, the fan-out semiconductor package has the form in which the I/O terminals of the semiconductor chip are redistributed and disposed up to an external portion of the semiconductor chip through the connection structure formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
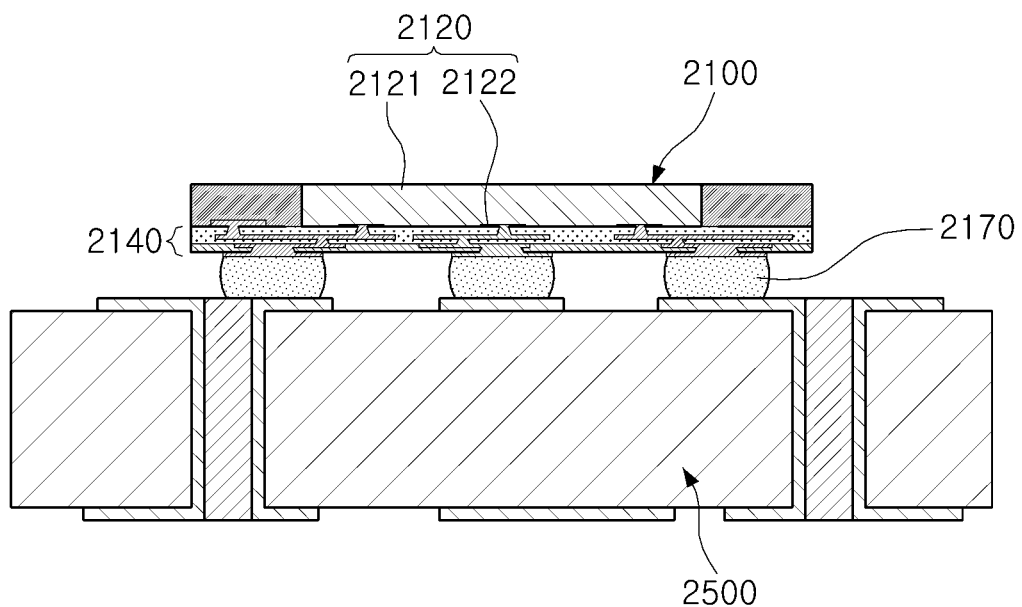
FIG. 8 is a schematic cross-sectional view illustrating a case in which a fan-out semiconductor package is mounted on a mainboard of an electronic device.

FIG. 8 is a cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, and the like. In other words, as described above, as the fan-out semiconductor package 2100 includes the connection structure 2140 capable of redistributing the connection pads 2122 up to a fan-out region that is beyond a size of the semiconductor chip 2120 on the semiconductor chip 2120, the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using a separate interposer substrate, the fan-out semiconductor package may be implemented to have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out electronic component package may be implemented in a more compact form than that of a general package-on-package (POP) type using a printed circuit board (PCB), and may solve a problem caused by a warpage phenomenon.

Meanwhile, the fan-out semiconductor package refers to package technology for mounting the semiconductor chip on the mainboard of the electronic device, or the like, as described above, and protecting the semiconductor chip from external impacts. The fan-out semiconductor package is a concept different from that of a printed circuit board (PCB) such as an interposer substrate, or the like, having a scale, a purpose, and the like, different from those of the fan-out semiconductor package, and having the fan-in semiconductor package embedded therein.

Hereinafter, a semiconductor package including a metal layer for shielding electromagnetic waves having an excellent side surface covering force will be described with reference to the drawings.

Figure 9:
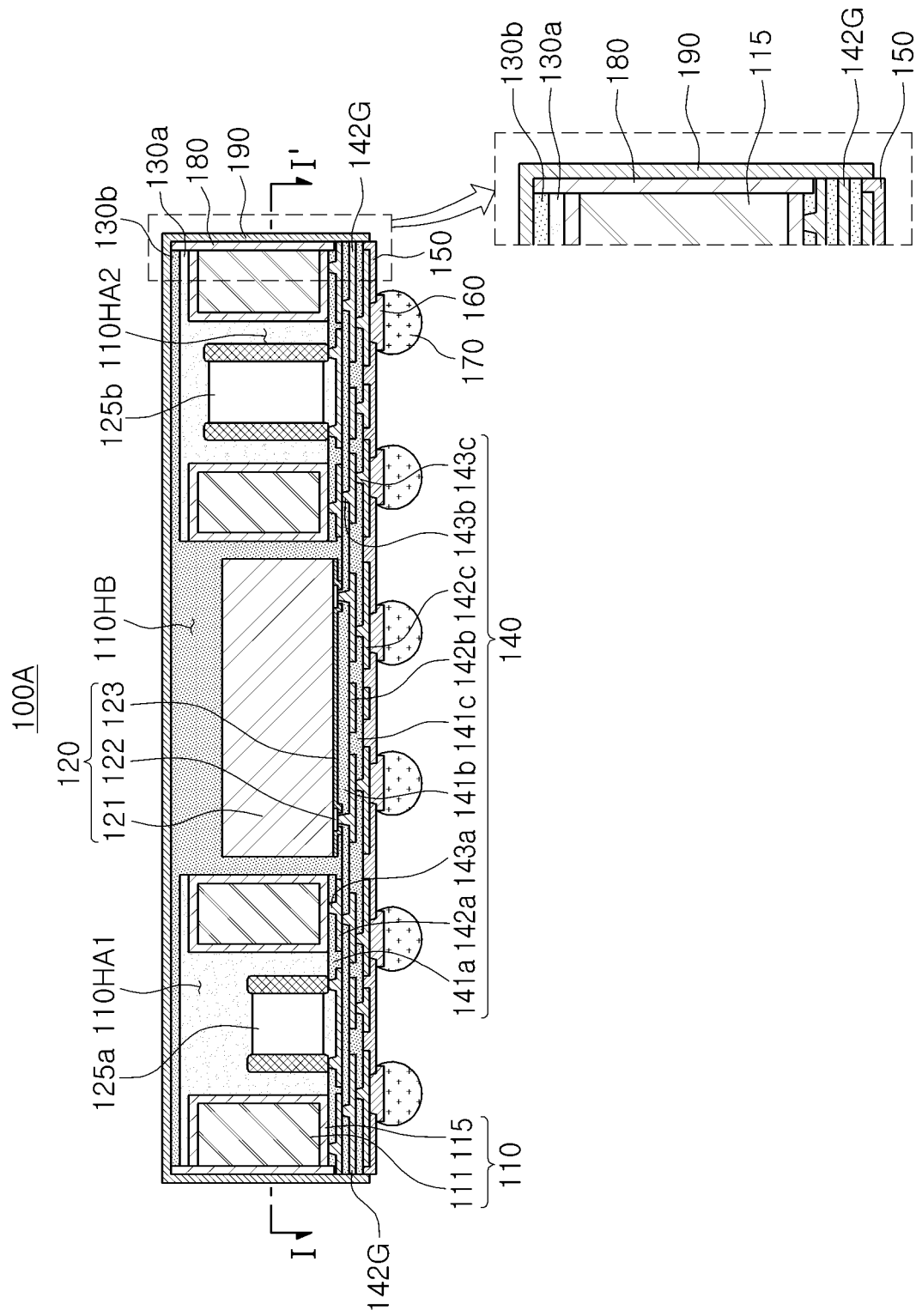
FIG. 9 is a schematic cross-sectional view illustrating an example of a semiconductor package.

FIG. 9 is a schematic cross-sectional view illustrating an example of a semiconductor package.

Figure 10:
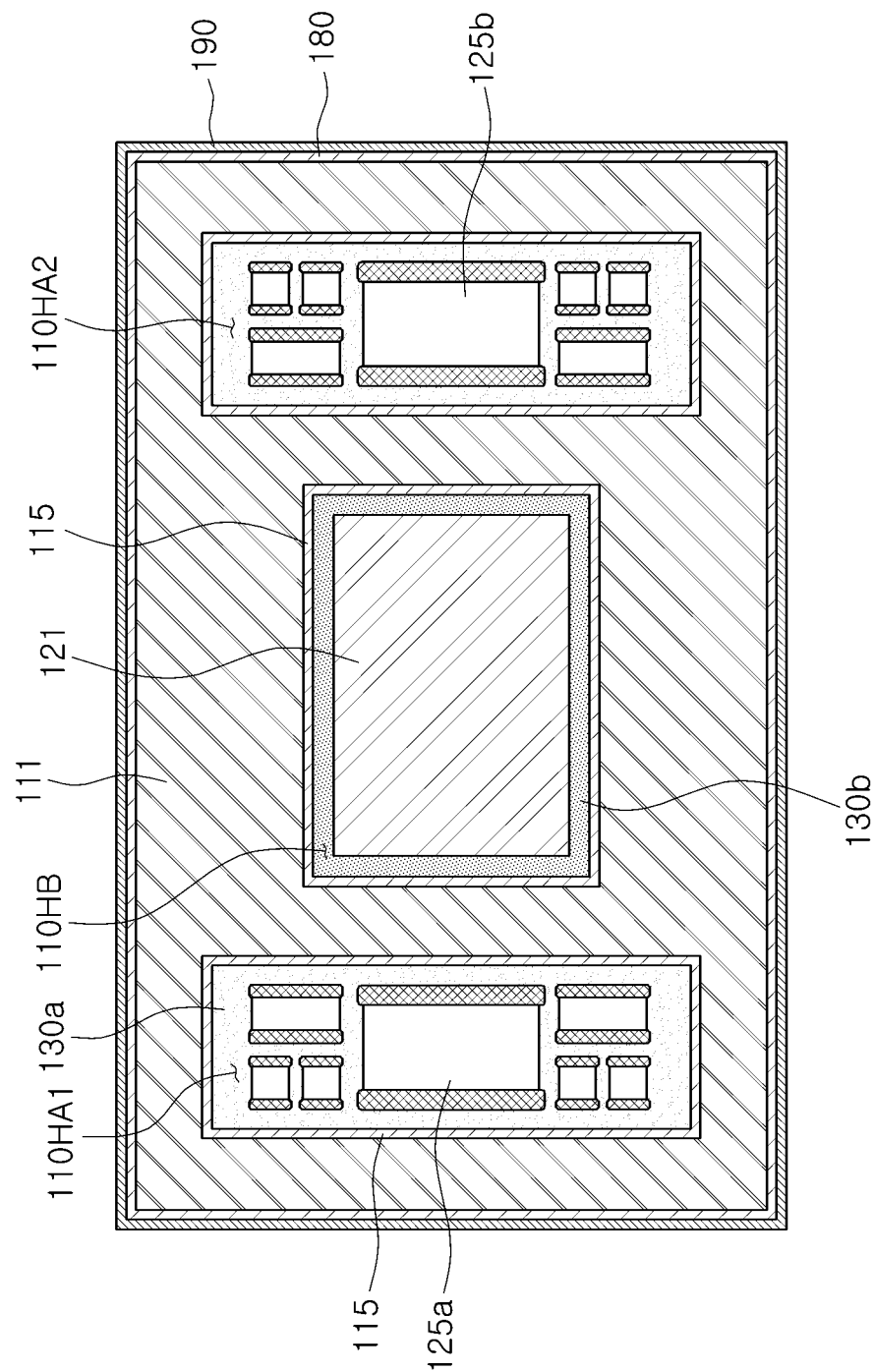
FIG. 10 is a schematic plan view taken along line I-I' of the semiconductor package of FIG. 9.

FIG. 10 is a schematic plan view taken along line I-I' of the semiconductor package of FIG. 9.

Referring to FIGS. 9 and 10, a semiconductor package 100A according to an example may include a frame 110 having first through-holes 110HA1 and 110HA2 and a second through-hole 110HB, at least one passive component 125*a* and at least one passive component 125*b* disposed in the first through-holes 110HA1 and 110HA2 of the frame 110, a semiconductor chip 120 disposed in the second through-hole 110HB of the frame 110, and having an active surface on which the connection pad 122 is disposed, and an inactive surface opposing the active surface, a first encapsulant 130*a* encapsulating at least portions of the frame 110 and the passive components 125*a* and 125*b*, a second encapsulant 130*b* encapsulating at least portions of the frame 110 and the semiconductor chip 120, a connection structure 140 disposed on the frame 110, lower surfaces of the passive components 125*a* and 125*b*, and the active surface of the semiconductor chip 120, and including a ground pattern layer 142G, a passivation layer 150 disposed on the connection structure 140, an underbump metal layer 160 disposed on an opening of the passivation layer 150, an electrical connection metal 170 disposed on the passivation layer 150 and connected to the underbump metal layer 160, a side surface cover layer 180 covering an outer side surface of the frame 110 at a periphery of the frame 110, and a metal layer 190 disposed on an upper surface of the second encapsulant 130b, extending downwardly from the upper surface of the second encapsulant 130b along the side surface cover layer 180 to cover the side surface cover layer 180, and covering a portion of the side surface of the connection structure 140.

The side surface cover layer 180 may cover an outer side surface of the frame 110, an upper end of the side surface cover layer 180 may cover the outer side surface of the second encapsulant 130b, and a lower end of the side surface cover layer 180 may cover a portion of the connection structure 140. The side surface cover layer 180 may extend only to an upper portion above the ground pattern layer 142G, which is a wiring layer to which a ground signal is applied in the connection structure 140. Therefore, an outer side surface of the ground pattern layer 142G may be covered by a metal layer 190 in a lower portion of the side surface cover layer 180 and may be directly connected to the metal layer 190.

The metal layer 190 may be disposed outside of the package to form a portion of the upper surface and the side surface of the semiconductor package 100A. The metal layer 190 may cover the upper surface of the second encapsulant 130b, and may extend downwardly while covering the side surface cover layer 180 along the outer side surface of the semiconductor package 100A. The metal layer 190 may cover at least a portion of the side surface of the connection structure 140 in a lower portion, and may cover at least a portion of the passivation layer 150, as illustrated. However, in another embodiment, a lower end of the metal layer 190 may not be located at the same level as the lower surface of the passivation layer 150, but may be located at a higher level. Therefore, at least the portion of the passivation layer 150 may be exposed to the outside without being covered by the metal layer 190 on the side surface of the package. According to embodiments, on the side surface of the package, not only the passivation layer 150 but also a portion of the connection structure 140 may be exposed to the outside without being covered by the metal layer 190.

As described above, a deposition method such as sputtering may be mainly used as an electromagnetic wave technology. However, in recent materials used as frames and encapsulants, and the like, whose properties are improved, an amount of a glass fiber and/or a ceramic filler is large therein, and accordingly, etching of the material is not good. Therefore, when a metal layer for EMI shielding is formed by sputtering, or the like, it is difficult to secure a coverage of the metal layer on the side surface of the package in which the glass fiber or the ceramic filler is exposed, and adhesion may be deteriorated.

In addition, in the process in the related art, since the metal layer for EMI shielding is formed after a singulation process, a singulated unit package should be transferred to a separate adhesive tape for sputtering, and a condition should be optimized not to be deposited on a lower surface to which the electrical connection metal is attached. In addition, in order to secure a sputtering coverage, an interval between unit packages should be set, and the unit package should be detached from the adhesive tape again after the sputtering process, which may complicate the process.

On the other hand, the semiconductor package 100A according to an example may form the side surface cover layer 180 and the metal layer 190 while performing singulation in a plurality of steps, as described with reference to FIGS. 12A to 12C, such that the process may be simplified. In addition, since the metal layer 190 is formed on the side surface cover layer 180 after forming the side surface cover layer 180 on the outer side surface of the package, the coverage and the adhesion of the metal layer 190 on the side surface of the package may be secured regardless of the material of the frame 110.

Hereinafter, each configuration included in the semiconductor package 100A according to an example will be described in more detail.

The frame 110 may improve the rigidity of the semiconductor package 100A depending on certain materials, and serve to secure uniformity of thicknesses of the first and second encapsulants 130a and 130b, or the like. The frame 110 may have a plurality of first through-holes 110HA1 and 110HA2, and a second through-hole 110HB. Each of the first and second through-holes 110HA1 and 110HA2, and 110HB may be disposed to be physically spaced apart from each other. The first through-holes 110HA1 and 110HA2 may penetrate the frame 110, and passive components 125a and 125b may be disposed in the first through-holes 110HA1 and 110HA2. As illustrated in FIG. 10, the passive components 125a and 125b may be disposed to be spaced apart from wall surfaces of the first through-holes 110HA1 and 110HA2 by a predetermined distance, and may be surrounded by the wall surfaces of the first through-holes 110HA1 and 110HA2, but is not limited thereto. The second through-hole 110HB may penetrate the frame 110 and the first encapsulant 130a, and a semiconductor chip 120 may be disposed in the second through-hole 110HB. The semiconductor chip 120 may be disposed to be spaced apart from a wall surface of the second through-hole 110HB by a predetermined distance, and may be surrounded by the wall surface of the second through-hole 110HB. However, such a form is only an example and may be variously modified to have other forms, and another function may be performed depending on such a form. The frame 110 may be omitted if necessary, but the case having the frame 110 may be more advantageous in securing the board level reliability as intended in the present disclosure.

The frame 110 may include a frame insulating layer 111 and a frame metal layer 115 surrounding the frame insulating layer 111. An insulating material may be used as the material of the frame insulating layer 111. In this case, the insulating material may be a thermosetting resin such as an epoxy resin, a thermoplastic resin such as a polyimide resin, an insulating material in which the thermosetting resin or the thermoplastic resin is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Such a frame 110 may serve as a supporting member.

The frame metal layer 115 may be disposed in an inner side wall of each of the first through-holes 110HA1 and 110HA2 and the second through-hole 110HB. As illustrated in FIG. 10, the frame metal layer 115 may surround each of the passive components 125a and 125b, and the semiconductor chip 120. The frame metal layer 115 may be introduced to improve an electromagnetic interference (EMI) shielding effect and a heat dissipation effect of the passive components 125a and 125b and the semiconductor chip 120. The frame metal layer 115 may include a conductive material such as copper (Cu), aluminum (Al), silver (Ag), tin (Sn), gold (Au), nickel (Ni), lead (Pb), titanium (Ti), or alloys thereof. The frame metal layer 115 may be formed using a known plating process, and may be formed of a seed layer and a conductor layer. The frame metal layer 115 may be used as a ground. In this case, the frame metal layer 115 may be electrically connected to a ground pattern layer 142G of the connection structure 140.

The semiconductor chip 120 may be an integrated circuit (IC) provided in an amount of several hundred to several million or more elements integrated in a single chip. The IC may be, for example, a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP). However, the present disclosure is not limited thereto, and the semiconductor chip may be a logic chip such as an analog-to-digital converter (ADC), an application-specific integrated circuit (ASIC), or the like, or a memory chip such as a volatile memory (for example, a dynamic random access memory (DRAM)), a non-volatile memory (for example, a read only memory (ROM)), a flash memory, or the like, but is not limited thereto. Moreover, these chip related components are also combined.

In the semiconductor chip 120, a side, on which connection pad 122 is disposed, is an active surface, and the opposite side is an inactive surface. The semiconductor chip 120 may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide layer, a nitride layer, or the like, or a double layer of an oxide layer and a nitride layer.

Each of the passive components 125a and 125b may be a capacitor such as a multilayer ceramic capacitor (MLCC) or a low inductance chip capacitor (LICC), an inductor such as a power inductor, a bead, or the like, independently. The passive components 125a and 125b may have different sizes and thicknesses. Moreover, each of the passive components 125a and 125b may have a thickness different from a thickness of the semiconductor chip 120. In the semiconductor package 100A according to an embodiment, the passive components 125a and 125b and the semiconductor chip 120 are sealed in different processes, so a problem of defects due to such thickness variations may be significantly reduced. The number of the passive components 125a and 125b are not particularly limited, and may be more or less than that illustrated in the drawings.

Meanwhile, in one example, the passive components 125a and 125b disposed in parallel with the semiconductor chip 120 may form a component built-in structure. The component built-in structure may include the passive components 125a and 125b, the frame 110, the first encapsulant 130a, a first insulating layer 141a, a first redistribution layer 142a, and a first via 143a of the connection structure 140. According to embodiments, the frame 110 in the component built-in structure may be omitted, and in this case, the side surface cover layer 180 and the metal layer 190 may be sequentially stacked on the outer side surface of the first encapsulant 130a.

The first encapsulant 130a may fill at least portions of the first through-holes 110HA1 and 110HA2, and may encapsulate one or more passive components 125a and 125b. An encapsulation form is not particularly limited, but may be a form in which the first encapsulant 130a surrounds at least portions of the passive components 125a and 125b. The first encapsulant 130a may cover at least portions of upper surfaces of the passive components 125a and 125b, and may fill at least a portion of a space between wall surfaces of the first through-holes 110HA1 and 110HA2 and side surfaces of the plurality of passive components 125a and 125b. The first encapsulant 130a may extend to the frame 110 to be disposed on the frame 110, and may be in contact with an upper surface of the frame metal layer 115.

The second encapsulant 130b may fill at least a portion of the second through-hole 110HB, and may encapsulate the semiconductor chip 120. An encapsulation form is not particularly limited, but may be a form in which the second encapsulant 130b surrounds at least a portion of the semiconductor chip 120. For example, the second encapsulant 130b may cover at least portions of the frame 110 and an inactive surface of the semiconductor chip 120, and may fill at least a portion of a space between a wall surface of the second through-hole 110HB and a side surface of the semiconductor chip 120. Meanwhile, the second encapsulant 130b may fill the second through-hole 110HB to thus serve as an adhesive for fixing the semiconductor chip 120 and reduce buckling at the same time, depending on certain materials. The second encapsulant 130b may be disposed in an upper portion of the semiconductor chip 120 as described above, may extend to upper portions of the passive components 125a and 125b and the frame 110, and may be disposed on the first encapsulant 130a on the passive components 125a and 125b and the frame 110. Thus, the first and second encapsulants 130a and 130b may be stacked sequentially and disposed on the passive components 125a and 125b and the frame 110, and the second encapsulant 130b may be only disposed directly on the semiconductor chip 120 among the semiconductor chip 120 and the passive components 125a and 125b.

The first and second encapsulants 130a and 130b may include an insulating material. The insulating material may be a material containing an inorganic filler and an insulating resin, for example, a thermosetting resin such as an epoxy resin, a thermoplastic resin such as a polyimide, or a resin in which a reinforcement such as an inorganic filler is contained in the thermosetting resin or the thermoplastic resin, in detail, an Ajinomoto build-up film (ABF), an FR-4 resin, a bismaleimide triazine (BT) resin, a resin, or the like. Moreover, an epoxy molding compound (EMC), a photo imageable encapsulant (PIE), or the like, may be used therefor. As needed, a material in which an insulating resin such as the thermosetting resin or the thermoplastic resin is impregnated in an inorganic filler together with a core material such as a glass fiber, may be used. The first and second encapsulants 130a and 130b may include the same or different materials.

The connection structure 140 may redistribute the connection pads 122 of the semiconductor chip 120. Through the connection structure 140, several tens or several hundreds of connection pads 122 of the semiconductor chip 120 having various a variety of functions may be distributed, and may be physically and/or electrically externally connected through the electrical connection metal 170 depending on functions. The connection structure 140 may include a first insulating layer 141a disposed on the frame 110 and the passive components 125a and 125b, a first redistribution layer 142a disposed on the first insulating layer 141a, a first via 143a connecting the first redistribution layer 142a, the passive components 125a and 125b, and the frame metal layer 115, a second insulating layer 141b disposed on the first insulating layer 141a, a second redistribution layer 142b disposed on the second insulating layer 14b, a second via 143b connecting the first and second redistribution layers 142a and 142b or connecting the connection pad 122 of the semiconductor chip 120 and the second redistribution layer 142b while penetrating the second insulating layer 141b, a third insulating layer 141c disposed on the second insulating layer 141b, a third insulating layer 141c disposed on the second insulating layer 141b, a third redistribution layer 142c disposed on the third insulating layer 141c, and a third via 143c connecting the second and third redistribution layers 142b and 142c while penetrating the third insulating layer 141c. The first redistribution layer 142a may be electrically connected to the passive components 125a and 125b, and the second and third redistribution layers 142b and 142c may be electrically connected to the connection pad 122 of the semiconductor chip 120 and the passive components 125a and 125b. The connection structure 140 may include the number of insulating layers, redistribution layers, and vias, greater than illustrated in the drawings.

A material of each of the insulating layers 141a, 141b, and 141c may be an insulating material such as a PID resin may also be used as the insulating material. That is, each of the insulating layers 141a, 141b, and 141c may be a photosensitive insulating layer. When the insulating layers 141a, 141b, and 141c have photosensitive properties, the insulating layers 141a, 141b, and 141c may be formed to have a smaller thickness, and a fine pitch of each of the vias 143a, 143b, and 143c may be achieved more easily. Each of the insulating layers 141a, 141b, and 141c may be a photosensitive insulating layer including an insulating resin and an inorganic filler. When the insulating layers 141a, 141b, and 141c are multiple layers, materials of the insulating layers 141a, 141b, and 141c may be the same as each other, and may also be different from each other, if necessary. When the insulating layers 141a, 141b, and 141c are multiple layers, the insulating layers 141a, 141b, and 141c may be integrated with each other depending on processes, such that a boundary therebetween may not be readily apparent. The number of insulating layers, greater than those illustrated in the drawings, may be provided.

The second and third redistribution layers 142b and 142c, among the redistribution layers 142a, 142b, and 142c, may substantially serve to redistribute the connection pad 122, and a formation material thereof may be a conductive material such as copper (Cu), aluminum (Al), silver (Ag), tin (Sn), gold (Au), nickel (Ni), lead (Pb), titanium (Ti), or alloys thereof. The redistribution layers 142a, 142b, and 142c may perform various functions depending on designs of corresponding layers. For example, the redistribution layers may include ground (GND) pattern layers 142G, and may include power (PWR) patterns, signal (S) patterns, and the like. Particularly, at least a portion of the ground pattern layers 142G may be exposed through aside surface of the connection structure 140, and the exposed surface may be shielded by the metal layer 190. Here, the signal (S) patterns may include various signals except for the ground (GND) signals, the power (PWR) signals, and the like, such as data signals, and the like. In addition, the redistribution layers 142a, 142b, and 142c may include via pad patterns, electrical connection metal pad patterns, and the like.

The vias 143a, 143b, and 143c may electrically connect the redistribution layers 142a, 142b, and 142c, the connection pad 122, the passive components 125a and 125b, and the like, formed on different layers, to each other, resulting in an electrical path in the semiconductor package 100A. A material of each of the vias 143a, 143b, and 143c may be a conductive material such as copper (Cu), aluminum (Al), silver (Ag), tin (Sn), gold (Au), nickel (Ni), lead (Pb), titanium (Ti), or alloys thereof. Each of the vias 143a, 143b, and 143c may be completely filled with a conductive material, or the conductive material may be formed along a wall of the vias. In addition, the vias 143a, 143b, and 143c may have all shapes known in the related art, such as a tapered shape, a cylindrical shape, and the like.

The passivation layer 150 may protect the connection structure 140 from external physical or chemical damage. The passivation layer 150 may have an opening exposing at least a portion of the third redistribution layer 142c of the connection structure 140. The number of openings, formed in the passivation layer 150, may be several tens to several thousands. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The underbump metal layer 160 may improve connection reliability of the electrical connection structure 170 to improve board level reliability of the semiconductor package 100A. The underbump metal layer 160 may be connected to the third redistribution layer 142c of the connection structure 140 exposed through the openings of the passivation layer 150. The underbump metal layer 160 may be formed in the openings of the passivation layer 150 by any known metallization method using any known conductive material such as metal, but is not limited thereto.

The electrical connection metal 170 may physically and/ or electrically connect the semiconductor package 100A to an external power source. For example, the semiconductor package 100A may be mounted on the mainboard of the electronic device through the electrical connection metal 170. The electrical connection metal 170 may be formed of a conductive material, for example, a solder, or the like. However, this is only an example, and a material of each of the electrical connection metal 170 is not limited thereto. Each of the electrical connection metals 170 may be a land, a ball, a pin, or the like. The electrical connection metals 170 may be formed as a multilayer or single layer structure. When the electrical connection metal 170 includes the plurality of layers, the electrical connection metal includes a copper pillar and a solder. When the electrical connection metal includes the single layer, the electrical connection metal includes a tin-silver solder or copper. However, the electrical connection metal is only an example, and the present disclosure is not limited thereto. The number, an interval, a disposition form, and the like, of the electrical connection metals 170 are not particularly limited, but may be sufficiently modified depending on design particulars by those skilled in the art. For example, the electrical connection metals 170 may be provided in an amount of several tens to several thousands, or may be provided in an amount of several tens to several thousands or more or several tens to several thousands or less.

At least one of the electrical connection metals 170 may be disposed in a fan-out region of the semiconductor chip 120. The fan-out region may refer to a region except for a region in which the semiconductor chip 120 is disposed. The fan-out package may have excellent reliability as compared to a fan-in package, may allow a plurality of input/output (I/O) terminals to be implemented, and may facilitate a 3D interconnection. In addition, as compared to a ball grid array (BGA) package, a land grid array (LGA) package, or the like, the fan-out package may be manufactured to have a small thickness, and may have price competitiveness.

The side surface cover layer 180 may cover the outer side surface of the frame 110, and may surround the outer side surface of the frame 110 in the entire package, as illustrated in FIG. 10. An upper end of the side surface cover layer 180 may cover the outer side surface of the second encapsulant 130*b*, and a lower end of the side surface cover layer 180 may cover a portion of the connection structure 140. The side surface cover layer 180 may extend only to an upper portion above the ground pattern layer 142G so as not to cover the ground pattern layer 142G in the connection structure 140. The side surface cover layer 180 may include an insulating material, and a material including an insulating resin may be used as the insulating material. Particularly, the side surface cover layer 180 may include a non-conductive adhesive, for example, polydimethylsiloxane (PDMS) and silica. The side surface cover layer 180 may include a different material from the first and second encapsulants 130*a* and 130*b*, and thus, a boundary therebetween may be readily apparent. For example, the side surface cover layer 180 may not contain a glass fiber or a ceramic filler.

The metal layer 190 may be disposed outside of the package so as to form a portion of the upper surface and the side surface of the semiconductor package 100A. The metal layer 190 may cover an upper surface of the second encapsulant 130*b*, cover side surfaces of the side surface cover layer 180 and the connection structure 140, and may cover a portion of the passivation layer 150. Particularly, the metal layer 190 may cover the ground pattern layer 142G of the connection structure 140. The metal layer 190 may expose a portion of the connection structure 140 and/or a portion of the passivation layer 150 in a lower portion below the ground pattern layer 142G. The metal layer 190 may include a metal material such as copper (Cu), aluminum (Al), silver (Ag), tin (Sn), gold (Au), nickel (Ni), lead (Pb), titanium (Ti), or alloys thereof.

Figure 11:
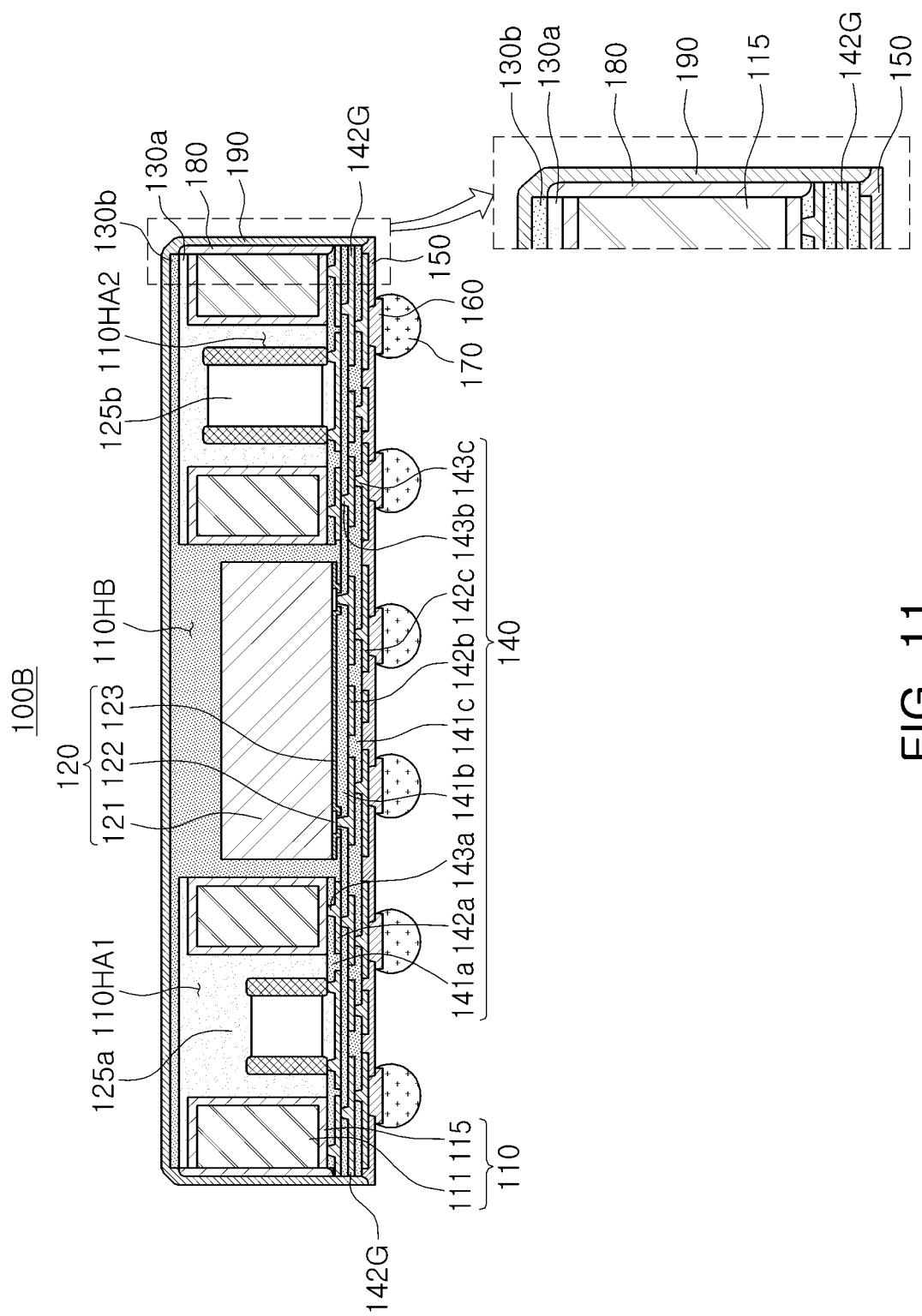
FIG. 11 is a schematic cross-sectional view illustrating another example of a semiconductor package.

FIG. 11 is a schematic cross-sectional view illustrating another example of the semiconductor package.

Referring to FIG. 11, in a semiconductor package 100B according to another example, an upper end of the side surface cover layer 180 may not cover the second encapsulant 130*b*, or may cover only a portion of the second encapsulant 130*b*. According to embodiments, the side surface cover layer 180 may cover only a portion of the first encapsulant 130*a* on the frame 110. Such a structure may be determined by a height of filling a material forming the side surface cover layer 180 during a manufacturing process to be described below. In this case, the metal layer 190 may also form an inclined surface between the upper surface and the side surface at a corner of the package. In addition, the side surface cover layer 180 may have a curved upper end and a lower end, and the metal layer 190 may also have a curvature at the lower end thereof. The metal layer 190 may further have a region extending horizontally from the lower end to the outside of the package. Other configurations are substantially the same as those described in the above-described semiconductor package 100A and the like, and a detailed description thereof will be omitted.

Figure 12A:
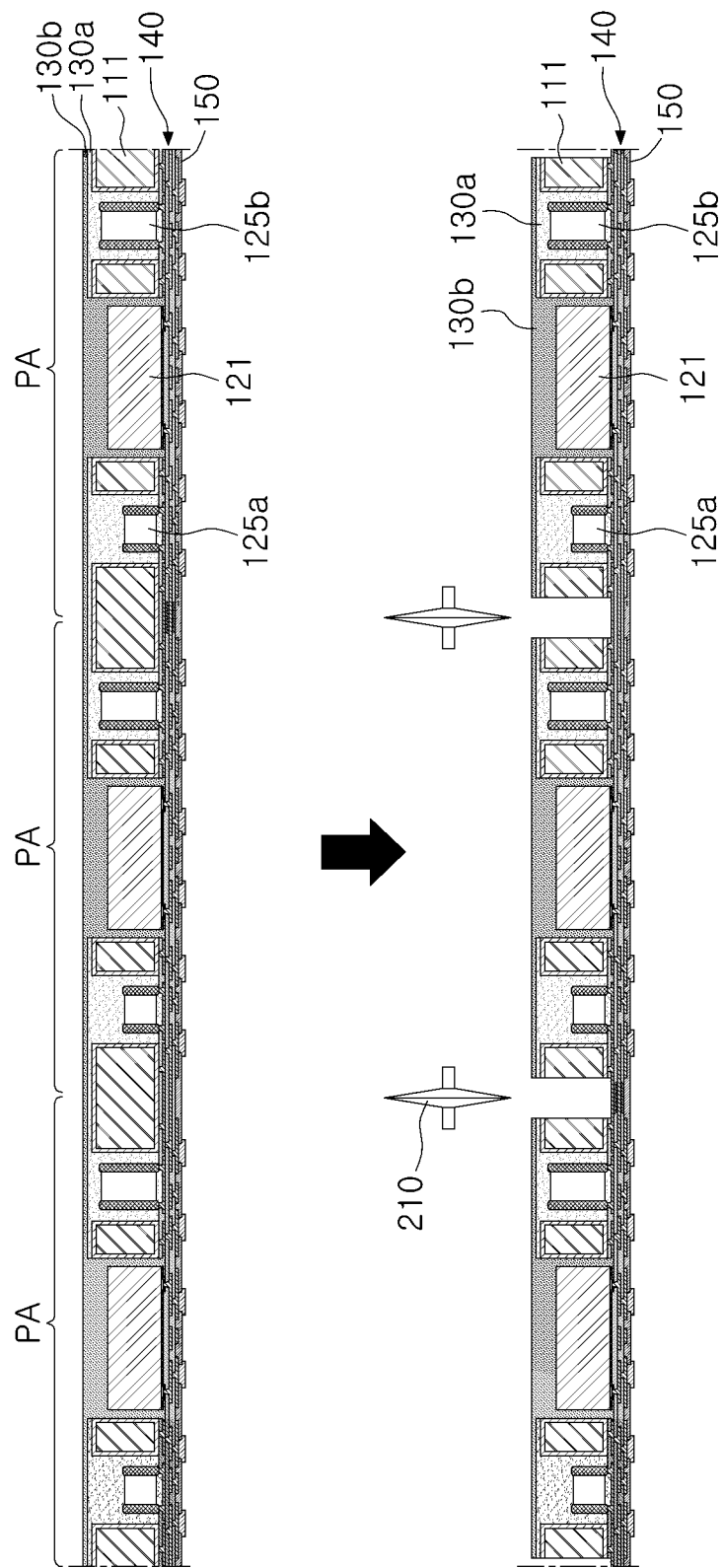
FIGS. 12A to 12C are schematic process drawings illustrating a manufacturing example of the semiconductor package of FIG. 9.
Figure 12B:
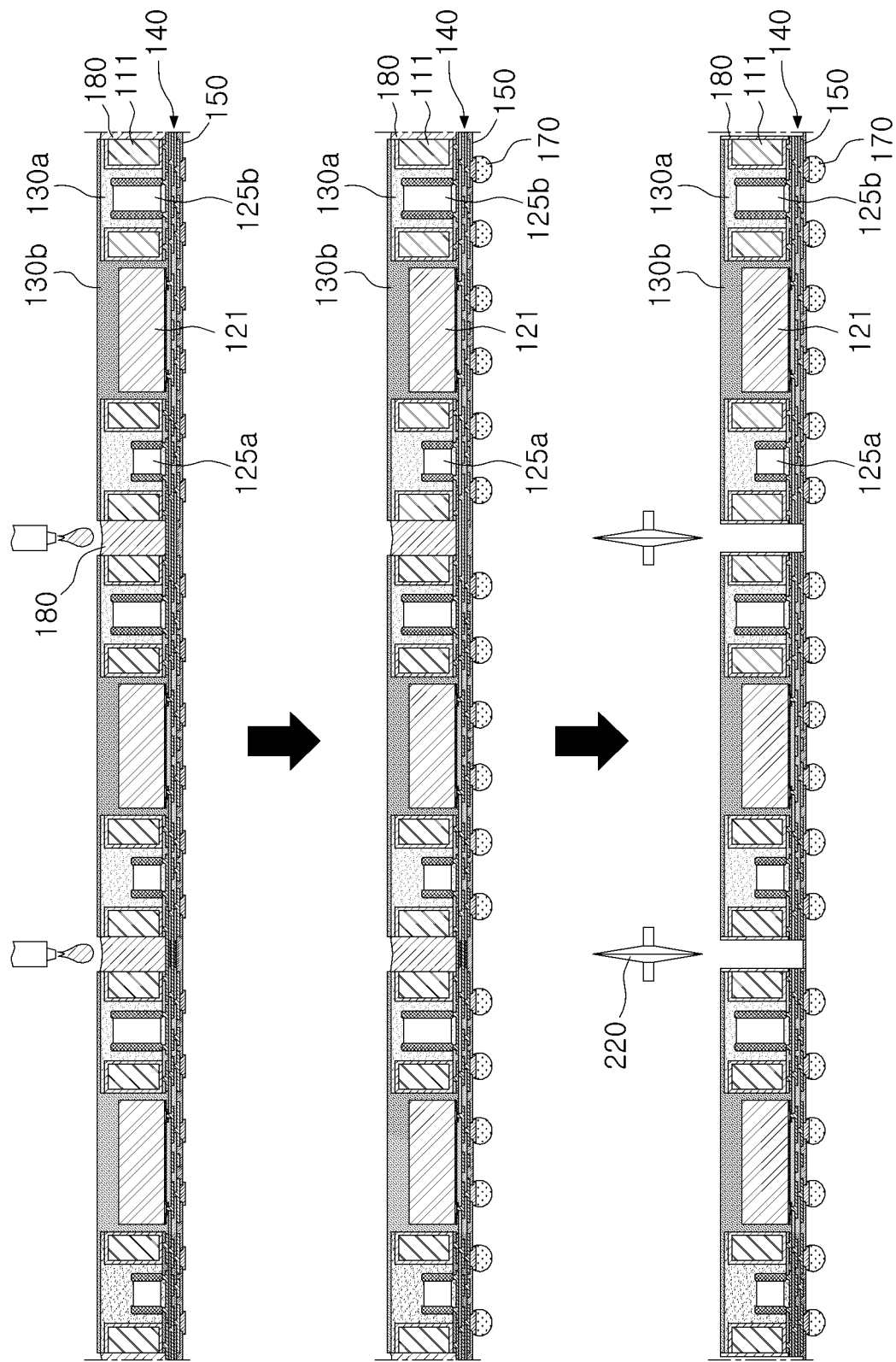
Figure 12C:
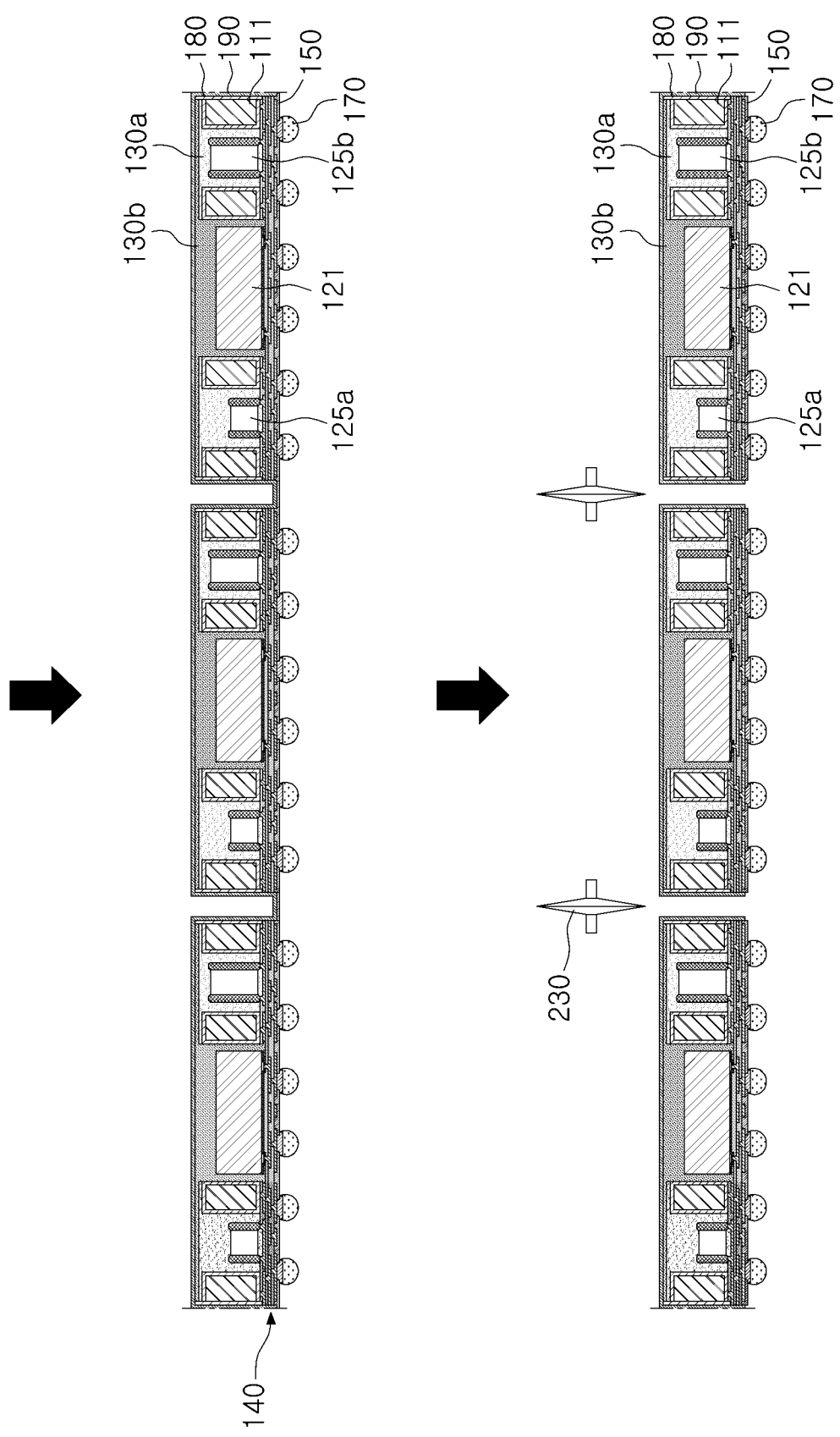

FIGS. 12A to 12C are schematic process drawings illustrating a manufacturing example of the semiconductor package of FIG. 9.

Referring to FIG. 12A, in a frame 110, first through-holes 110HA1 and 110HA2 penetrating an upper surface and a lower surface of the frame 110 are formed, passive components 125*a* and 125*b* are disposed, and then encapsulated with the first encapsulant 130*a*. Then, a portion of the connection structure 140 is formed. A second through-hole 110HB is formed in the frame 110, a semiconductor chip 120 is disposed, and then encapsulated with the second encapsulant 130*b*. Then, the other portion of the connection structure 140, the passivation layer 150, and the underbump metal layer 160 are formed in a lower portion thereof. These process steps may be performed simultaneously for a plurality of unit packages (PA) by using a frame 110 of a large size so as to facilitate mass production. According to embodiments, the underbump metal layer 160 may be formed at a later step. Next, a sawing process may be performed along a singulation line by using a first sawing apparatus 210 at a boundary of the unit packages (PA), such that the frame 110, the first and second encapsulants 130*a* and 130*b*, and the portion of the connection structure 140 may be removed. The sawing process may be performed at a depth such that the ground pattern layer 142G is not exposed by the sawing process. For example, sawing may proceed up to at least a portion of a first insulating layer 141*a* of the connection structure 140.

Referring to FIG. 12B, an insulating material is sprayed to a region in which the frame 110, the first and second encapsulants 130*a* and 130*b*, and the portion of the connection structure 140 are removed along a singulation line using a dispenser to fill a material of the side surface cover layer 180. Next, an electrical connection metal 170 may be formed on the underbump metal layer 160. A formation method of the electrical connection metal 170 is not particularly limited, and may be formed by a known method well known in the art depending on its structure and form. The electrical connection metal 170 may be fixed by reflow, a portion of the electrical connection metal 170 may be embedded in the passivation layer 150 in order to enhance a fixing power, and the other portion of the electrical connection metal 170 may be exposed outwardly, such that the reliability may be improved. In some cases, the electrical connection metal 170 may be also formed up to the underbump metal layer 160, and thereafter, a customer company may form an electrical connection metal by a separate subsequent process, if necessary. Next, a sawing process may be performed along a singulation line using a second sawing apparatus 220 at a boundary of the unit packages (PA), such that the portions of the side surface cover layer 180, the connection structure 140, and the passivation layer 150 may be removed. The sawing process may be performed to a lower portion below the ground pattern layer 142G such that the ground pattern layer 142G is exposed by the sawing process. The sawing process may process, for example, to a portion of the connection structure 140 or to a portion of the passivation layer 150. The second sawing apparatus 220 may be performed with a narrow width using a blade thinner than that of the first sawing apparatus 210. Therefore, the side surface cover layer 180 may remain on the outer side surface of the frame 110 at the boundary of the unit packages (PA).

Referring to FIG. 12C, a metal layer 190 may be deposited by sputtering or spraying. The metal layer 190 may not be formed on a lower surface to which the electrical connection metal 170 is attached, since the metal material is transferred and deposited from an upper portion thereof. The metal layer 190 may cover an upper surface of the second encapsulant 130*b*, cover portions or all of a side surface of the connection structure 140 including the side surface cover layer 180 and the ground pattern layer 142G on the side surface, and may also cover a portion of the passivation layer 150. Next, a sawing process may be performed along a singulation line using a third sawing apparatus 230 at a boundary of the unit packages (PA), such that the packages may be completely separated into individual packages as illustrated in FIG. 9. Therefore, the side surface of the passivation layer 150 which have been connected in the previous steps or the side surfaces of the connection structure 140 and the passivation layer 150 may be exposed.

Figure 13:
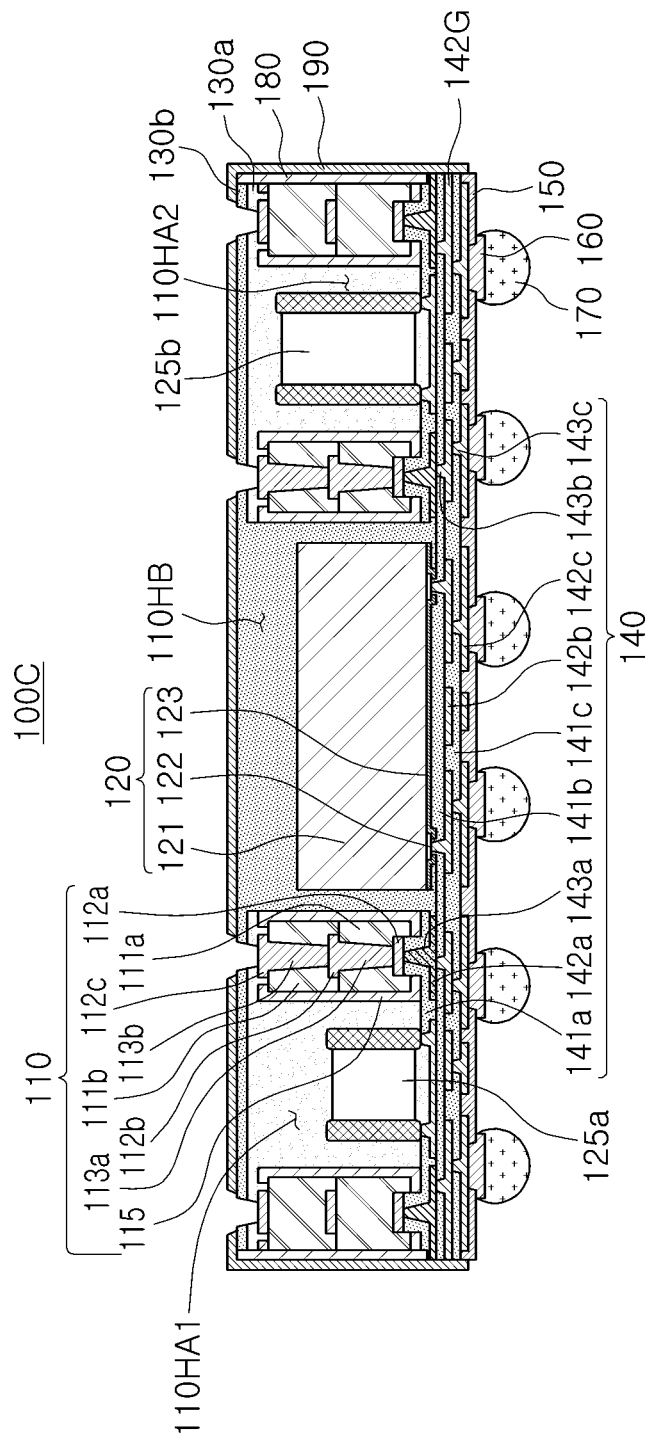
FIG. 13 is a schematic cross-sectional view illustrating another example of a semiconductor package.

FIG. 13 is a schematic cross-sectional view illustrating another example of a semiconductor package.

Referring to FIG. 13, in a semiconductor package 100C according to another example, a frame 110 may include a first frame insulating layer 111a in contact with a connection structure 140, a first wiring layer 112a in contact with the connection structure 140 and embedded in the first frame insulating layer 111a, a second wiring layer 112b disposed on a side opposing the side in which the first wiring layer 112a of the first frame insulating layer 111a is embedded, a second frame insulating layer 111b disposed on the first frame insulating layer 111a and covering the second wiring layer 112b, a third wiring layer 112c disposed on the second frame insulating layer 111b, and a frame metal layer 115. The first to third wiring layers 112a, 112b, and 112c may be electrically connected to the connection pad 122 of the semiconductor chip 120 and the passive components 125a and 125b. The first wiring layer 112a and the second wiring layer 112b, as well as the second wiring layer 112b and the third wiring layer 112c may be electrically connected to each other through the first frame via 113a and the second frame via 113b, passing through the first frame insulating layer 111a and the second frame insulating layer 111b, respectively.

The first wiring layer 112a may be recessed inwardly of the first frame insulating layer 111a. As described above, when the first wiring layer 112a is recessed inwardly of the first frame insulating layer 111a and a step is provided between a lower surface of the first frame insulating layer 111a and a lower surface of the first wiring layer 112a, the first wiring layer 112a may be prevented from being contaminated by bleeding of a formation material of the first encapsulant 130a. A thickness of each of the wiring layers 112a, 112b, and 112c of the frame 110 may be greater than that of each of the redistribution layers 142a, 142b, and 142c of the connection structure 140.

When a hole for the first frame via 113a is formed, some pads of the first wiring layer 112a may serve as a stopper. In this regard, it may be advantageous in a process in that the first frame via 113a has a tapered shape in which a width of an upper surface is greater than a width of a lower surface. In this case, the first frame via 113a may be integrated with a pad pattern of the second wiring layer 112b. In addition, when a hole for the second frame via 113b is formed, some pads of the second wiring layer 112b may serve as a stopper. In this regard, it may be advantageous in a process in that the second frame via 113b has a tapered shape in which a width of an upper surface is greater than a width of a lower surface. In this case, the second frame via 113b may be integrated with a pad pattern of the third wiring layer 112c.

Other configurations, for example, the contents of the side surface cover layer 180 and the metal layer 190 described with reference to FIG. 9 or FIG. 11, and the like, may also be applied to the semiconductor package 100C according to another example, and a detailed description will be omitted as it is substantially the same as those described in the above-described packages 100A and 100B, and the like. However, in the present embodiment, the metal layer 190 may be opened in a predetermined region to connect the wiring layer 112c of the frame 110 to a solder, or the like, disposed on the upper portion.

Figure 14:
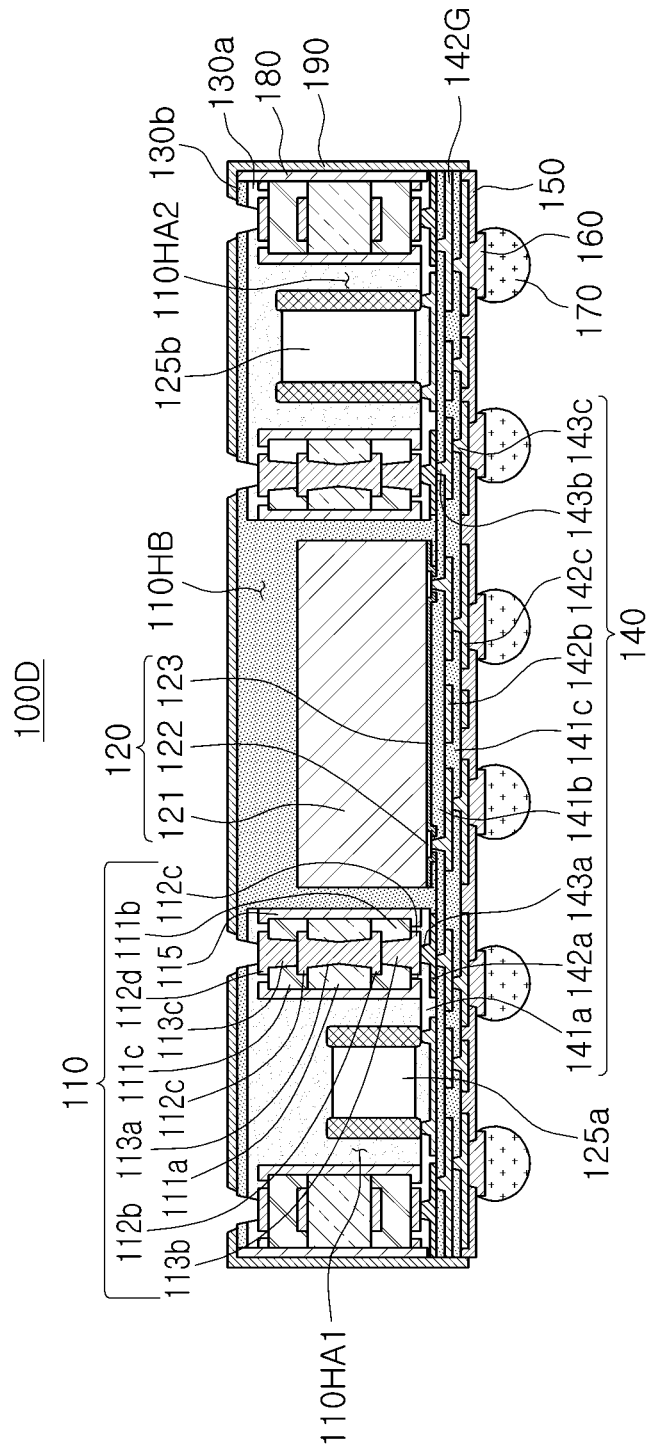
FIG. 14 is a schematic cross-sectional view illustrating another example of a semiconductor package.

FIG. 14 is a schematic cross-sectional view illustrating another example of a semiconductor package.

Referring to FIG. 14, in a semiconductor package 100D according to another example, a frame 110 may include a first frame insulating layer 111a, a first wiring layer 112a and a second wiring layer 112b disposed on both sides of the first frame insulating layer 111a, a second frame insulating layer 111b disposed on the first frame insulating layer 111a and covering the first wiring layer 112a, a third redistribution layer 112c disposed on the second frame insulating layer 111b, a third frame insulating layer 111c disposed on the first frame insulating layer 111a and covering the second wiring layer 112b, and a fourth wiring layer 112d disposed on the third frame insulating layer 111c. The first to fourth wiring layers 112a, 112b, 112c, and 112d may be electrically connected to connection pads 122. Since the frame 110 includes a further large number of wiring layers 112a, 112b, 112c, and 112d, the connection structure 140 may be further simplified. Therefore, a decrease in a yield depending on a defect occurring in a process of forming the connection structure 140 may be improved. Meanwhile, the first to fourth wiring layers 112a, 112b, 112c, and 112d may be electrically connected to each other through the first to third frame vias 113a, 113b, and 113c penetrating the first to third frame insulating layers 111a, 111b, and 111c, respectively.

The frame insulating layer 111a may have a thickness greater than those of the second frame insulating layer 111b and the third frame insulating layer 111c. The first frame insulating layer 111a may be basically relatively thick in order to maintain rigidity, the second frame insulating layer 111b and the third frame insulating layer 111c may be introduced in order to form a larger number of wiring layers 112c and 112d. The first frame insulating layer 111a may include an insulating material different from those of the second frame insulating layer 111b and the third frame insulating layer 111c. For example, the first frame insulating layer 111a may be, for example, prepreg including a core material, a filler, and an insulating resin, and the second insulating layer 111b and the third insulating layer 111c may be an ABF film or a PID film including a filler and an insulating resin. Similarly, the first frame via 113a penetrating the first frame insulating layer 111a may have a diameter greater than those of the second and third frame vias 113b and 113c passing through the second and third frame insulating layers 111b and 111c, respectively. A thickness of each of the wiring layers 112a, 112b, 112c, and 112d of the frame 110 may be greater than that of each of the redistribution layers 142a, 142b, and 142c of the connection structure 140.

Other configurations, for example, the contents of the side surface cover layer 180 and the metal layer 190 described with reference to FIG. 9 or FIG. 11, and the like, may also be applied to the semiconductor package 100D according to another example, and a detailed description will be omitted as it is substantially the same as those described in the above-described packages 100A and 100B, and the like. However, in the present embodiment, the metal layer 190 may be opened in a predetermined region in order to connect the wiring layer 112d of the frame 110 to the solder disposed on the upper portion, or the like.

Figure 15:
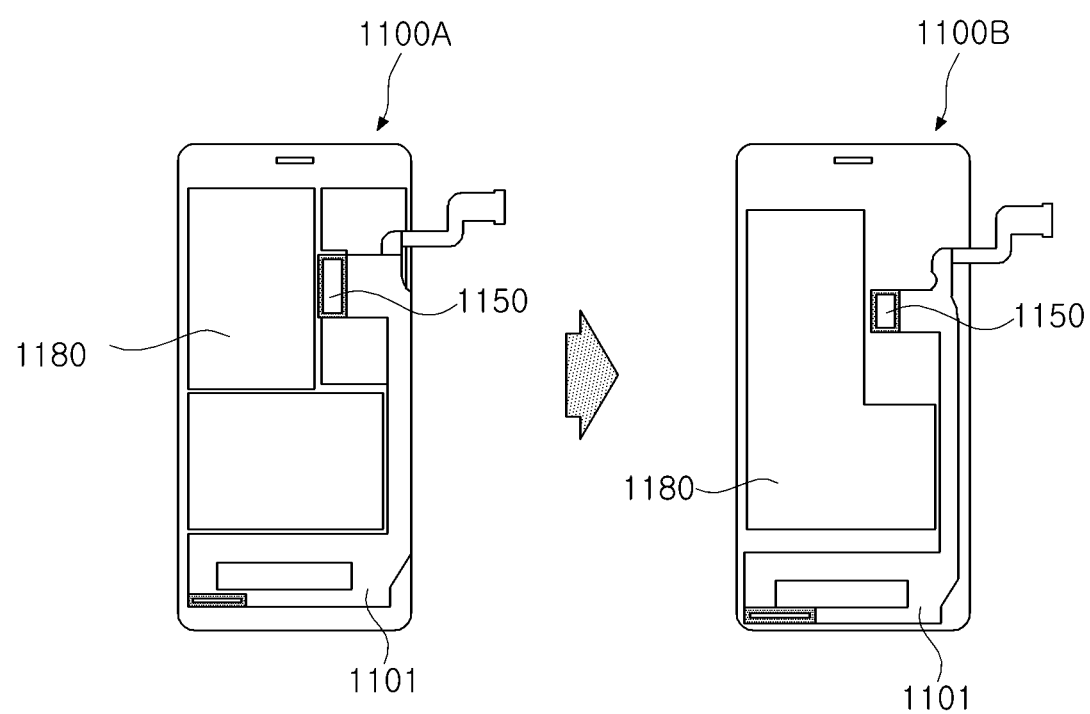
FIG. 15 is a schematic plan view illustrating an effect in a case in which the semiconductor package according to the present disclosure is applied to an electronic device.

FIG. 15 is a schematic plan view illustrating an effect in a case in which the semiconductor package according to the disclosure is applied to an electronic device.

Referring to FIG. 15, recently, as a size of display for mobile devices 1100A and 1100B increases, the necessity of increasing battery capacity is increasing. As the battery capacity increases, an area occupied by the battery 1180 increases. In this regard, a size of a printed circuit board 1101 such as a mainboard is required to be reduced. Thus, due to a reduction in a mounting area of a component, an area occupied by a module 1150 including a power management integrated circuit (PMIC) and passive components is gradually decreased. In this case, when the semiconductor packages 100A, 100B, 100C, and 100D according to an embodiment is applied to the module 1150, a size is able to be significantly reduced. Thus, the area, which becomes smaller as described, above may be effectively used.

As set forth above, according to an embodiment in the present disclosure, a semiconductor package with improved lateral shielding performance may be provided.

While the exemplary embodiments have been shown and described above, it will be apparent to those skilled in the art that modifications and variations could be made without departing from the scope of the present invention as defined by the appended claims.

What is claimed is:

1. A semiconductor package, comprising:
   a frame having a first through-hole;
   a semiconductor chip disposed in the first through-hole of the frame, and having an active surface on which a connection pad is disposed and an inactive surface disposed opposing the active surface;
   a first encapsulant covering at least a portion of each of the inactive surface and a side surface of the semiconductor chip;
   a connection structure disposed on the active surface of the semiconductor chip, and including a redistribution layer electrically connected to the connection pad of the semiconductor chip and a ground pattern layer;
   a side surface cover layer covering at least an outer side surface of the frame at a periphery of the frame; and
   a metal layer disposed on an upper surface of the first encapsulant, and extending downwardly from the upper surface of the first encapsulant along the side surface cover layer to cover the side surface cover layer and a portion of the side surface of the connection structure.

2. The semiconductor package of claim 1, wherein the side surface cover layer extends from the outer side surface of the frame to an upper portion above the ground pattern layer of the connection structure.

3. The semiconductor package of claim 2, wherein an outer side surface of the ground pattern layer is covered with the metal layer.

4. The semiconductor package of claim 1, further comprising: a passivation layer disposed on the connection structure, and
   wherein a lower end of the metal layer is located at a level higher than a lower surface of the passivation layer.

5. The semiconductor package of claim 1, wherein the side surface cover layer and the first encapsulant are made of different materials.

6. The semiconductor package of claim 1, wherein the side surface cover layer includes a non-conductive adhesive.

7. The semiconductor package of claim 1, wherein the side surface cover layer covers at least a portion of an outer side surface of the first encapsulant.

8. The semiconductor package of claim 1, wherein the frame further has a second through-hole, and further comprises at least one passive component disposed in the second through-hole of the frame.

9. The semiconductor package of claim 8, further comprising a second encapsulant covering at least portions of each of an upper surface and a side surface of the passive component, and
   wherein the first encapsulant covers at least a portion of the second encapsulant.

10. The semiconductor package of claim 9, wherein the side surface cover layer covers an outer side surface of the second encapsulant.

11. The semiconductor package of claim 1, wherein at least a portion of a side surface of the first encapsulant is exposed from the side surface cover layer.

12. The semiconductor package of claim 11, wherein the metal layer has an inclined surface between an upper surface of the metal layer disposed on the upper surface of the first encapsulant and a side surface of the metal layer disposed on the side surface cover layer.

13. The semiconductor package of claim 1, wherein the frame includes a first frame insulating layer, a first wiring layer in contact with the connection structure and embedded in the first frame insulating layer, and a second wiring layer disposed on a side opposing a side of the first frame insulating layer in which the first wiring layer is embedded, and
   the first and second wiring layers are electrically connected to the connection pad.

14. The semiconductor package of claim 13, wherein the frame further comprises a second frame insulating layer disposed on the first frame insulating layer and covering the second wiring layer, and a third wiring layer disposed on the second frame insulating layer, and
   the third wiring layer is electrically connected to the connection pad.

15. The semiconductor package of claim 1, wherein the frame includes a first frame insulating layer, and a first wiring layer and a second wiring layer disposed on both sides of the first frame insulating layer, and
   the first and second wiring layers are electrically connected to the connection pad.

16. The semiconductor package of claim 15, wherein the frame further comprises a second frame insulating layer disposed on the first frame insulating layer and covering the first wiring layer and a third wiring layer disposed on the second frame insulating layer, and
   the third wiring layer is electrically connected to the connection pad.

17. The semiconductor package of claim 1, wherein the frame includes a glass fiber or a ceramic filler in contact with the side surface cover layer.

18. A semiconductor package, comprising:
   a semiconductor chip having an active surface on which a connection pad is disposed and an inactive surface opposing the active surface;
   a first encapsulant encapsulating at least a portion of each of the inactive surface and a side surface of the semiconductor chip;
   a connection structure disposed on the active surface of the semiconductor chip, and including a redistribution layer electrically connected to the connection pad of the semiconductor chip and a ground pattern layer;
   a component built-in structure disposed on the connection structure and surrounding the semiconductor chip and having at least one passive component embedded therein;
   a side surface cover layer covering at least a portion of an outer side surface of the component built-in structure at a periphery of the component built-in structure; and a metal layer disposed on an upper surface of the first encapsulant, and extending downwardly from the upper surface of the first encapsulant along the side surface cover layer to cover a portion of a side surface of the connection structure.

19. The semiconductor package of claim 18, wherein the component built-in structure includes the at least one passive component, a second encapsulant encapsulating the passive component, and a wiring layer disposed on a lower side of the passive component and electrically connected to the passive component, and the wiring layer is electrically connected to the connection pad through the redistribution layer.

20. The semiconductor package of claim 18, wherein the side surface cover layer includes a non-conductive adhesive.

* * * * *